United States Patent
Altekar et al.

(10) Patent No.: US 6,229,458 B1
(45) Date of Patent: May 8, 2001

(54) RATE 32/34 (D=0, G=9/I=9) MODULATION CODE WITH PARITY FOR A RECORDING CHANNEL

(75) Inventors: Shirish A. Altekar, Los Gatos; Shih-Ming Shih, San Jose, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/384,850

(22) Filed: Aug. 27, 1999

(51) Int. Cl.[7] .............................. H03M 7/00; H03M 5/00
(52) U.S. Cl. .................................. 341/59; 341/58
(58) Field of Search ................. 341/59, 58, 68, 341/69; 709/200, 227

(56) References Cited

U.S. PATENT DOCUMENTS 6,018,304 * 8/2000 Bessios ................................ 341/58
6,097,320 * 8/2000 Kuki ...................................... 341/58

OTHER PUBLICATIONS

Cideciyan, Roy D.; Dolivo, Francois; Hermann, Reto; Hirt, Walter, "A PRML System for Digital Magnetic Recording", Jan. 1, 1992, IEEE Journal on Selected Areas in Communications.

* cited by examiner

Primary Examiner—Patrick Wamsley

(57) ABSTRACT

A system and method for encoding a sequence of 32 bit digital data words into a sequence of 33 or more bit codewords having constraints of (d=0, G=9/I=9) for recording upon a magnetic medium within a magnetic recording channel are disclosed. The method includes dividing each 32 bit digital data word into three 8-bit bytes and another 8-bit byte, expanding the another 8-bit byte into a 9-bit word, dividing the 9-bit word into three 3-bit subparts, forming three 11-bit intermediate blocks, each comprising one of the three 3-bit subparts and one of the three 8-bit bytes, encoding each of the three 11-bit intermediate blocks to generate three 11-bit encoded words, and forming each codeword from a set of the three 11-bit encoded words. The set of the three 11-bit encoded words satisfies a predetermined minimum zero run length (d) constraint, a predetermined maximum zero run length (G) constraint, and a predetermined maximum interleave zero run length (I) coding constraint.

28 Claims, 8 Drawing Sheets

$q_1 = x_{21} x_{20} x_{19}$ $q_2 = x_{18} x_{17} x_{16}$

| q1 | q2 | e[8] | e[7] | e[6] | e[5] | e[4] | e[3] | e[2] | e[1] | e[0] |
|----|----|------|------|------|------|------|------|------|------|------|
| 0 | 0 | 0 | x[23] | x[22] | x[21] | x[20] | x[19] | x[18] | x[17] | x[16] |
| 0 | 1 | 1 | 0 | x[22] | x[23] | 1 | 0 | x[21] | x[20] | x[19] |
| 1 | 0 | 1 | 0 | x[22] | x[23] | 0 | 1 | x[18] | x[17] | x[16] |
| 1 | 1 | 1 | 0 | x[22] | x[23] | x[23] | x[23] | 0 | 0 | 0 |

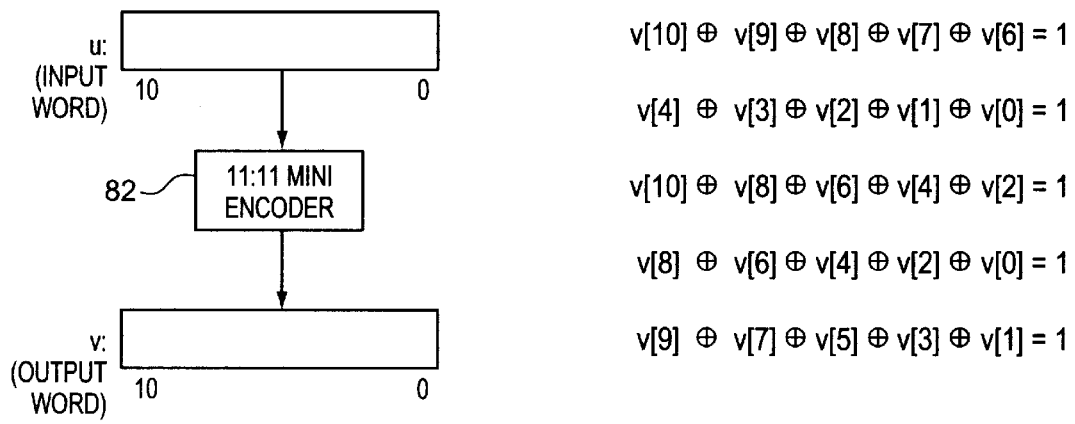

$v[10] \oplus v[9] \oplus v[8] \oplus v[7] \oplus v[6] = 1$ $v[4] \oplus v[3] \oplus v[2] \oplus v[1] \oplus v[0] = 1$ $v[10] \oplus v[8] \oplus v[6] \oplus v[4] \oplus v[2] = 1$ $v[8] \oplus v[6] \oplus v[4] \oplus v[2] \oplus v[0] = 1$ $v[9] \oplus v[7] \oplus v[5] \oplus v[3] \oplus v[1] = 1$

$$z[33] \oplus z[32] \oplus z[31] \oplus z[30] \oplus \ldots \oplus z[2] \oplus z[1] \oplus z[0] = 1 \qquad [1]$$

$$z[33] \oplus z[32] \oplus z[31] \oplus z[30] \oplus \ldots \oplus z[2] \oplus z[1] \oplus z[0] = 0 \qquad [1']$$

FIG. 8

$$y[0] = y[33] \oplus y[32] \oplus y[29] \oplus y[28] \oplus y[25] \oplus y[24] \oplus y[21] \oplus y[20] \oplus y[17] \oplus$$
$$y[16] \oplus y[13] \oplus y[12] \oplus y[9] \oplus y[8] \oplus y[5] \oplus y[4] \oplus y[1] \oplus S$$
$$S = y[31] \oplus y[30] \oplus y[27] \oplus y[26] \oplus y[23] \oplus y[22] \oplus y[19] \oplus y[18] \oplus y[15] \oplus$$
$$y[14] \oplus y[11] \oplus y[10] \oplus y[7] \oplus y[6] \oplus y[3] \oplus y[2]$$

FIG. 9

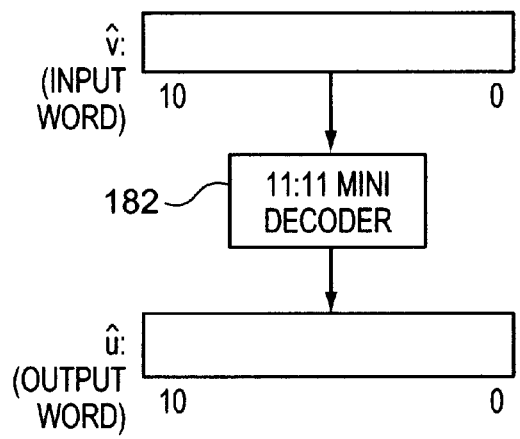

```
a=!u[10]&!u[9]&!u[0]&!u[7]&!u[6]&!u[5]&!u[4]&!u[3]&!u[2]&!u[1]&!u[0];
b=v[10]&v[9]&v[8]&!v[7]&v[6]&!v[5]&!v[4]&v[3]&!v[2]&!v[1]&!v[0];
violationA=a&!b;
```

```
violationA=e[8]&e[7]|e[5]&e[4]&e[3]|e[2]&e[1]&e[0]
          |e[8]&!e[5]&!e[4]&!e[3]|!(e[4]^e[3])&(e[2]|e[0]|e[0])&e[8];
```

RATE 32/34 (D=0, G=9/I=9) MODULATION CODE WITH PARITY FOR A RECORDING CHANNEL

BACKGROUND OF THE INVENTION

1. Field of the Invention

The present invention relates generally to modulation codes and methods. More specifically, run length limited (RLL) modulation codes together with a parity constraint enabling magnetic or optical recording systems to achieve higher data recording densities than with other modulation codes without sacrificing the reliability of playback data recovery are disclosed.

2. Description of Related Art

Modulation codes have been employed in magnetic and optical recording systems to limit recorded bit sequences to those that can be more reliably detected. In particular, RLL modulation codes have been employed with systems utilizing peak detection, partial response, maximum likelihood (PRML) detection, decision feedback equalization (DFE) channels, detection, and fixed delay tree search (FDTS) detection.

Partial response channels for magnetic data storage devices include a (1−D) dicode channel, a PR4 (1−D$^2$) channel, an EPR4 (1+D−D$^2$−D$^3$) channel, and more generally, a channel described by a polynomial of degree N:

$$p_0+p_1D+p_2D^2+ \ldots +p_ND^N$$

where the coefficients $p_0, p_1, \ldots, P_N$ are real numbers. In each of these systems, a Viterbi detector is frequently utilized to achieve maximum likelihood detection of user data being played back from the recording medium.

A modulation code for a PRML data recording and playback channel is selected to balance efficiency and robustness against errors. The efficiency of a code is measured by a code rate k/n where k represents the number of user bits that are mapped into n recorded code bits by the encoder. Modulation codes with higher rates are deemed to be more efficient. Modulation codes which are more robust exclude more of the bit sequences that cannot be reliably detected. Thus, making the modulation code more robust results in a lower code rate. However, because detector performance can degrade with increasing channel densities, e.g., by approximately 6–9 dB per doubling of the channel density, higher code rates are desirable.

Rate 8/9 (d=0, G=4/I=4) modulation codes have been used. U.S. Pat. Nos. 4,707,681 and 5,260,703 describe examples of such rate 8/9 modulation codes. Rate 16/17 (d=0, G=6/I=7) modulation codes have also been used. U.S. Pat. No. 5,635,933 describes an example of such a rate 16/17 modulation code. In the (d, G/I) PRML code constraints for use in magnetic recording of digital data in disk memory devices, parameters d and G are global constraints which represent the minimum and maximum of zero run lengths, respectively, in the interleaved NRZI (INRZI) code bit sequence, where a run length of zeros may be regarded as a period of silence in the detection process.

The parameter I is the maximum interleave zero run length constraint and represents the maximum run length of zeros in the particular all-even or all-odd INRZI subsequences. Because a minimum run length of zeroes is inapposite in the context or PRML channel, the parameter d generally has a value of 0. A small value of G is desirable for accurate timing and gain recovery and control. In addition, a small value of I reduces the size of the path memory required in the maximum likelihood (ML) or Viterbi detector. These constraints must hold across codeword boundaries. Although described in terms of the (d, G/I) PRML code constraints for use in magnetic recording of digital data in disk memory devices, the code constraints and the apparatus for encoding and decoding data are applicable, however, to any PR signalizing system employing ML detection.

In recording systems using partial response signals such as PR4 or EPR4 and maximum likelihood, i.e., Viterbi algorithm, detection, it is critical that consecutive even and odd samples into the detector frequently have nonzero values. It is also critical to constrain consecutive samples input into a partial response detector so as to frequently include nonzero values. Such a constraint ensures that timing recovery and automatic gain loops have sufficient information to perform adequately.

In addition to the (0, G/I) run length constraints described above, it is desirable to have a parity constraint which forces each codeword to have even or odd parity. Significant coding gain results in digital recording systems when such a code is used in conjunction with the Viterbi algorithm operating on a trellis that is matched to the parity constraint, or in conjunction with a post-processor that can advantageously use the parity information to correct detected errors.

The parity code is an instance of a more general technique used in high density recording known as trellis coding. Trellis coding is a source coding technique used in a variety of contexts, from high-speed modems to MPEG decoding, to produce a sequence of bits from an incoming stream that conforms to certain desired characteristics. A trellis coder is a signal-space coder based on a finite state machine (FSM) and is so named because the FSM may be conveniently represented by its trellis.

What is needed is a system and method for generating higher rate modulation codes to in order to improve detector performance with increasing magnetic channel recording densities in magnetic data storage devices.

SUMMARY OF THE INVENTION

A system and method for encoding a sequence of 32 bit digital data words into a sequence of 33 or more bit codewords in consonance with predetermined minimum zero run length (d), predetermined maximum zero run length (G) and maximum interleave zero run length (I) coding constraints for recording upon a recording medium within a recording channel are disclosed. It should be appreciated that the present invention can be implemented in numerous ways, including as a process, an apparatus, a system, a device, a method, or a computer readable medium such as a computer readable storage medium or a computer network wherein program instructions are sent over optical or electronic communication lines. Several inventive embodiments of the present invention are described below.

In one embodiment, the method includes dividing each 32 bit digital data word into three 8-bit bytes and another 8-bit byte, expanding the another 8-bit byte into a 9-bit word, dividing the 9-bit word into three 3-bit subparts, forming three 11-bit intermediate blocks, each comprising one of the three 3-bit subparts and one of the three 8-bit bytes, encoding each of the three 11-bit intermediate blocks to generate three 11-bit encoded words, and forming each codeword from a set of the three 11-bit encoded words. The set of the three 11-bit encoded words satisfies a predetermined minimum zero run length (d) constraint, a predetermined maximum zero run length (G) constraint, and a predetermined maximum interleave zero run length (I) coding constraint.

In another embodiment, a system encodes a sequence of 32 bit digital data words into a sequence of codewords having more than 32 bits for recording upon a recording medium, each of the digital data words includes three 8-bit bytes and another 8-bit byte. The system comprises an eight-to-nine bit expansion block and at least one 11-bit encoder. The eight-to-nine bit expansion block is configured to receive the another 8-bit byte of the digital data, where the expansion block is adapted to expand the 9-bit byte of digital data into a 9-bit expanded word comprising three 3-bit subparts. Each 11-bit encoder is adapted to receive an 11-bit word, each 11-bit word formed from one of the three 8-bit bytes of the digital data and from one of the three 3-bit subparts of the nine-bit expanded word. In addition, each 11-bit encoder is configured to output an 11-bit encoded word, the codeword being formed from three of the 11-bit encoded word, the codeword satisfying a predetermined minimum zero run length (d) constraint, a predetermined maximum zero run length (G) constraint, and a maximum interleave zero run length (I) coding constraint.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 4 sets forth an expansion function table and corresponding logic equations for the 8 bit to 9 bit expansion process to generate a 9 bit expansion word $\{e\}$ which form portions of the intermediate word;

FIG. 5 is a block diagram schematically illustrating the function of the 11-bit mini encoder;

FIG. 6 sets forth logic constraints for the 11-bit output word $\{v\}$ of the 11-bit mini encoder such that the 11-bit output word $\{v\}$ satisfies a (d=0, G=8/I=8) constraint;

FIG. 7 sets forth logic equations for the 11-bit mini encoder that receives the 11-bit input word $\{u\}$ of the 33-bit intermediate word and outputs the 11-bit output word of the 34-bit codeword;

FIG. 8 sets forth logic constraints for determining the parity bit P of the 34-bit output codeword;

FIG. 9 sets forth logic equations for computation of the y[0] parity bit P carried out in the INRZI domain;

FIG. 11 is a block diagram schematically illustrating the function of the 11-bit mini decoder;

FIG. 12 sets forth logic equations for the 11-bit mini decoder that receives the 11-bit input word $\{\hat{v}\}$ and outputs the 11-bit output word $\{\hat{u}\}$ of the 33-bit intermediate word;

DESCRIPTION OF SPECIFIC EMBODIMENTS

Systems and methods for 32/34 (D=0, G=9/I=9) rate modulation code with even (or odd) parity for a magnetic recording channel are disclosed. The following description is presented to enable any person skilled in the art to make and use the invention. Descriptions of specific applications are provided only as examples. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Although the embodiments are described in terms of PRML detection in magnetic recording systems, it is to be understood that these embodiments are not limited to such applications but rather may be utilized in, for example, optical recording systems.

Figure 1:
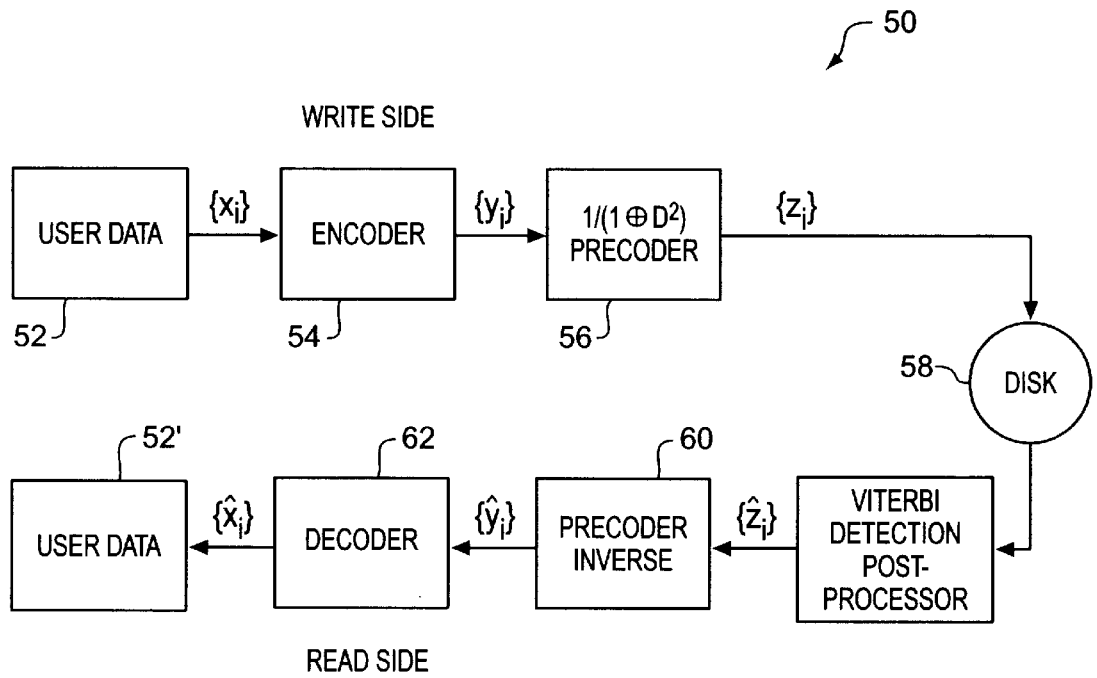
FIG. 1 is a simplified block diagram of a magnetic recording and playback system.

FIG. 1 is a simplified block diagram of a magnetic recording and playback system 50, such as a hard disk drive. Although an encoding method will be described in the context of a hard disk drive as a preferred environment in which the method is to be used, it is to be understood that the principles of the method may be applied to other devices, such as magnetic tape recording or optical recording. On the recording portion or write side of the magnetic recording and playback system 50, user data blocks 52 of data $\{x_i\}$ are received from a source, such as a host computer (not shown). Although not shown, the user data blocks may be passed through an error correction encoder which generates and appends ECC remainder bytes to the block in accordance with a pre-established ECC polynomial and scheme. Any suitable conventional error correction encoder, for example, may be utilized and examples of error correction encoders are not described herein for purposes of clarity.

Each data block having data $\{x_i\}$, preferably have a predetermined number of ECC bytes appended, passes through a modulation encoder 54. The modulation encoder 54 encodes the user data blocks, each block being a stream of four-byte (32 bit) user data words, preferably including the ECC bytes, into a sequence of 34 bit codewords $\{y_i\}$, in accordance with a rate 32/34 modulation code (d=0, G=9/I=9) and even (or odd) parity constraint. The output of the modulation encoder 54, i.e. the 34 bit codeword $\{y_i\}$, are INRZI (interleaved NRZI) codebits.

With the magnetic recording and playback system 50, each encoded codeword $\{y_i\}$ is then passed serially through a precoder 56 having function $1/(1 \oplus D^2)$. The output of the precoder 56 are NRZ (non-return-to-zero) codebits or precoded codewords $\{z_i\}$. The function performed by the precoder can be represented by $z_i = y_i \oplus z_{i-2}$. The precoded codewords $\{z_1\}$ are then recorded as sequences of magnetic flux transitions within a data track defined on a storage surface of a magnetic recording disk 58.

On the playback portion or read side of the magnetic recording and playback system 50, the magnetic flux transitions on the magnetic recording disk 58 induces magnetic flux transitions in a read head element. The magnetic flux transitions induced in the read head element are subjected to, for example, analog/digital filter-equalization processes, quantized as digital samples, and input to a Viterbi detector 59 that implements a Viterbi algorithm. The Viterbi algorithm makes use of the code constraints imposed by the rate 32/34 modulation code in order to generate a playback codeword sequence output which is most likely, although not necessarily, a correct reproduction of the original codeword sequence.

In addition, a post-processor that advantageously utilizes the parity information in each code word to detect and correct errors may be used in conjunction with the Viterbi detector to improve the reliability of the codeword sequence output. The output of the Viterbi detector or the post-processor $\{\hat{z}_i\}$ is then passed through an precoder inverse 60 having function $(1 \oplus D^2)$ to generate the sequence $\{\hat{y}_i\}$. The function performed by the precoder inverse can be represented by $\hat{x}_i = \hat{z}_i \oplus \hat{z}_{i-2}$.

The playback codeword sequence $\{\hat{y}_i\}$ is then demodulated in a modulation decoder 62. The modulation decoder 62 performs the inverse of the modulation encoder 54 and decodes the sequence of 34 bit codewords $\{\hat{y}_i\}$ into user data blocks $\{\hat{x}_i\}$ as a stream of user data words. Using a rate 32/34 modulation code encoder, the output stream comprises four-byte (32 bit) user data words, in accordance with a rate 32/34 modulation code. In the absence of noise and errors, the input user data $\{x_i\}$ and the output user data $\{\hat{x}_i\}$ would be identical. Similarly, $\{\hat{y}_i\}$ would be identical to $\{y_i\}$ and $\{\hat{z}_i\}$ would be identical to $\{z_i\}$ in the absence of noise and errors as the decoder and the precoder inverse merely undoes the operations of the encoder and the precoder, respectively.

Following decoding by the modulation decoder 62, each playback data block may be passed through an error correction decoder (not shown) which uses the playback ECC bytes to locate and correct any correctable error bursts. The user data blocks 52', $\{\hat{x}_i\}$, are then returned to a requester, such as the host computer (not shown). If the error correction decoder determines that a data block includes uncorrectable errors, an error flag may be returned to the requester and a second attempt may be made to read the data block from the magnetic recording disk 58.

Serial digital data words $\{x_i\}$ to be modulation encoded are passed, input word by input word, i.e. four bytes, or 32 bits, at a time, into the modulation encoder 54. The 32 bits of each input user word are encoded according to an encoding function to be described into a 34 bit codeword $\{y_i\}$. Successive 34 bit codewords are then recorded in the magnetic recording disk 58.

Figure 2:
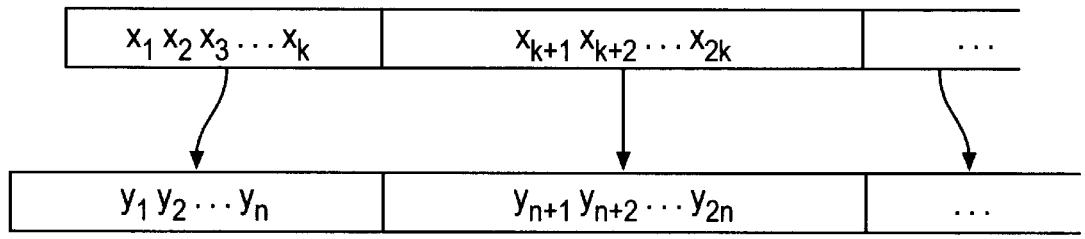
FIG. 2 schematically illustrates the general function of the modulation encoder.

FIG. 2 schematically illustrates the general function of the modulation encoder 54. The modulation encoder 54 operates on consecutive blocks of k number of input bits $\{x_1, x_2, \ldots, x_k\}$ and generates n number of output bits $\{y_1, y_2, \ldots, y_n\}$ for each input block of k input bits where n is greater than k. The mapping from the input bits $\{x_i\}$ to the output bits $\{y_i\}$ must be invertible, i.e., two different blocks of input bits must map to two different blocks of output bits. In addition, the sequence of output bits must satisfy certain constraints, i.e. (d, G/I), for all possible input sequences.

The output codewords of the encoder are valid codewords, if the (d, G/I) constraints are satisfied. Where the constraints are (d=0, G=9/I=9), a codeword is a valid codeword if the maximum zero run length is 9 and the maximum interleave zero run length is 9. As noted above, these constraints must also be satisfied across two consecutive code words. A parity constraint is also imposed upon the precoded codewords $\{z_i\}$, i.e., the output of the precoder. To satisfy the parity constraint, each precoded codewords $\{z_i\}$ must be the same parity, e.g. even or odd parity. Even and odd parities are defined, respectively, as:

$$\sum_{i=1}^{n} z_i \bmod 2 = 0 \quad \text{(even parity)}$$

$$\sum_{i=1}^{n} z_i \bmod 2 = 1 \quad \text{(odd parity)}$$

Figure 3:
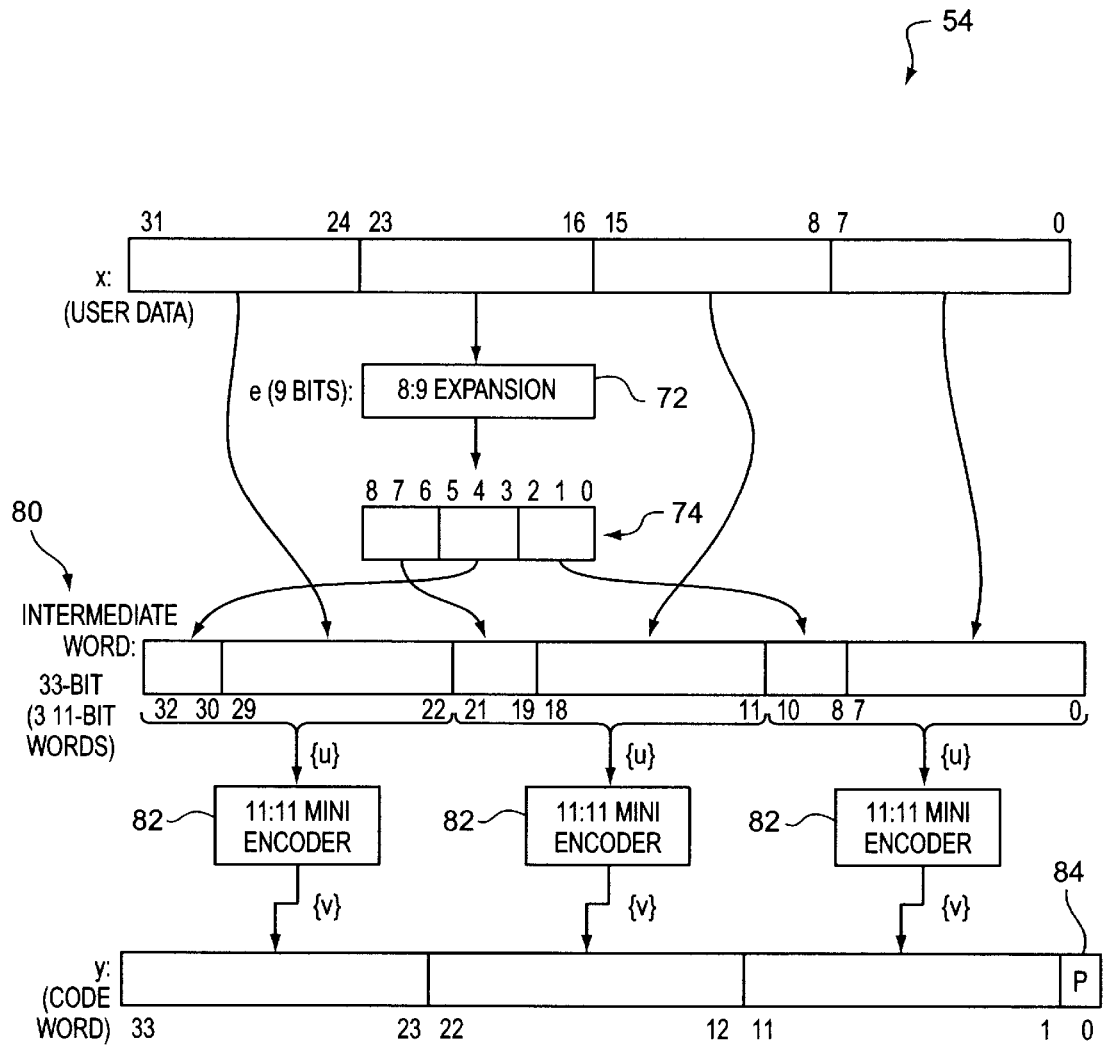
FIG. 3 shows a schematic illustrating the operations of the encoder.

FIG. 3 shows a schematic illustrating the operations of the encoder 54. The encoder receives as input user data $\{x_i\}$, i=0 to 31, i.e., a stream of four-byte (32 bit) user data words. The grouping of the 32 bits of input user data into four 8-bit bytes may be done in any convenient or appropriate fashion. One of the four bytes is subjected to an eight-to-nine bit expansion process 72 to generate a nine bit expansion word $\{e\}$ 74. Preferably, the byte having bits 16 to 23 is expanded. Alternatively, the byte having bits 8 to 15, or any other byte, may be expanded.

The resulting expanded block of nine bits 74 is divided into three blocks of three bits each and, along with the three non-expanded bytes of the user data $\{x\}$, form an intermediate 33-bit word 80 consisting of three 11-bit words. Preferably, the user data bytes having bits 0 to 7, 8 to 15, and 24 to 31 are utilized as bits 0 to 7, 11 to 18, and 22 to 29, respectively, of the intermediate word 80. Alternatively, if the user data byte having bits 8 to 15 are utilized in the 8:9 expansion, then the user data byte having bits 16 to 23 is utilized as bits 11 to 18 of the intermediate word 80. In addition, bits 0 to 2, 3 to 5, and 6 to 8 of the expanded 9 bit word 74 are utilized as bits 8 to 10, 19 to 21, and 30 to 32, respectively, of the intermediate word 80.

The 33 bit intermediate word 80 are separated into three 11-bit words. Each 11-bit word is encoded by a 11-bit mini encoder 82 to generate 11 bits of the encoded codeword $\{y_i\}$. The three 33 bit word along with the addition of a parity bit P 84 thus form the 34 bit codeword $\{y_i\}$. Without the parity bit P 84, the result is a 32/33 (d=0, G=8/I=8) code. Adding the parity bit P 84, the result is a 33/34 (d=0, G=9/I=9) code with parity constraint. The 32/33 (d=0, G=8/I=8) code may be independently useful in certain applications.

The above-described encoding process attempts to reduce the length of errors by limiting the amount of error propagation. In particular, if the codeword $\{y\}$ contains an error, the error may propagate and affect more bits on the decoder side. Thus, the encoding process facilitates in maintaining the output user data $\{\hat{x}\}$ the similar as the input user data $\{x\}$. The 8 bit to 9 bit expansion process 72 will now be explained in more detail with reference to FIG. 4.

FIG. 4 sets forth an expansion function table and corresponding logic equations for the 8 bit to 9 bit expansion process 72 to generate a 9 bit expansion word $\{e\}$ 74 which form portions of the intermediate word 80. Specific logical equations for each of the 9 expansion word bits may be created from the expansion function table or equations listed in FIG. 4. As shown, two internal variables $q_1$ and $q_2$ are utilized to determine the expansion word $\{e\}$ 74. The expansion function table or equations ensure that none of the three 3-bit sub-blocks, i.e. bits 0 to 2, bits 3 to 5, or bits 6 to 8, contain all one's (111). Although a specific expansion function table and a set of equations associated with the expansion function table are disclosed by way of example, any other suitable expansion function table or equations may be utilized so long as the expansion function ensures that none of the three sub-blocks contains all one's and so long as the expansion function is invertible such that the original byte can be derived from the 9 bit expanded output.

FIG. 5 is a block diagram schematically illustrating the function of the 11-bit mini encoder 82. The 11-bit mini encoder 82 receives a 11-bit input word {u}, encodes the input word {u}, and outputs a 11-bit output word {v}.

FIG. 6 sets forth logic constraints for the 11-bit output word {v} of the 11-bit mini encoder such that the 11-bit output word {v} satisfies a (d=0, G=8/I=8) constraint. The first two of the five logic equations ensure that the 11-bit output word {v} satisfies the global G=8 constraint while the last three of the five logic equations ensure that the 11-bit output word {v} satisfies the interleave I=8 constraint. In some applications, weaker constraints, i.e. (d=0, G/I) with G>8 and I>8, may be tolerated. One of ordinary skill in the art may readily make such modifications to the mini-encoder.

With these constraints (d=0, G=8/I=8), there are a total of 1807 valid choices for {v}. However, because there are $2^{11}$ or 2048 possible 11-bit input words {u}, not all possible inputs {u} can be mapped to a unique 11-bit output word {v}. Thus, restrictions to the 11-bit input words {u} may be utilized to limit the number of possible 11-bit input words {u} to N. There should be a sufficient number of possible 11-bit input words {u}, i.e. N should be such that $N^3 \geq 2^{32}$. In other words, N must be at least 1626. For example, the 11-bit input words {u} may be restricted to those that satisfy the logic equation:

$$u[10]+u[9]+u[8]=0,$$

i.e., those that do not satisfy the logic equation:

$$u[10]+u[9]+u[8]=1.$$

As described above, this restriction is implemented with the 8 bit to 9 bit expansion process which ensures that none of the three 3-bit sub-blocks, i.e. u[10], u[9], u[8] for each of the 11-bit input words {u} contain all one's (111). There are 1792 such 11-bit input words {u}. Any other restriction to the 11-bit input words {u} may be utilized. Although a specific example of the 11-bit mini-encoder is described, any other suitable 11-bit mini-encoder process may be utilized to obtain results satisfying the (d=0, G=8/I=8) constraint. If a weaker constraint (d=0, G>8/I>8) is desired, the constraints on the mini-encoder may be relaxed.

FIG. 7 sets forth logic equations for the 11-bit mini encoder that receives the 11-bit input word {u} of the 33-bit intermediate word and outputs the 11-bit output word of the 34-bit codeword. As shown, two internal variables {n} and {m} are utilized to determine the 11-bit output word {v}. Combining a set of three 11-bit output words of the codeword generated by the 11-bit mini encoder results in a 33-bit output word that satisfies a (d=0, G=8, I=8) constraint. As noted above, without the parity bit P, the 33-bit block output is a 32/33 (d=0, G=8/I=8) code. Adding the parity bit P 84, as will be described, the resulting codeword is a 32/34 (d=0, G=9/I=9) code.

Note that in the logic equations shown in FIG. 7 and other figures, "!" is the logical "not" function, "&" is the logical "and" function, "|" is the logical "or" function, and "^" is the logical "xor" function.

FIG. 8 sets forth logic constraints for determining the parity bit P of the 34-bit output codeword. As described, the output of the encoder and the input to the precoder is a 34-bit codeword {y}. The output of the precoder is a 34-bit codeword {z}. Bits 1 to 33 of the 34-bit output codeword {y} of the encoder are determined by the outputs of the three mini-encoders. Parity bit y[0] or P may be selected to satisfy the logic equation [1] as shown in FIG. 8. Alternatively, the parity bit y[0] may be selected to satisfy equation [1'] as shown in FIG. 8.

FIG. 9 sets forth logic equations for computation of the y[0] parity bit P carried out in the INRZI domain. Initializing a state bit S to 0, because of a sync-mark which ends in 00 or 11, the y[0] parity bit P may be determined using the logic equations as shown in FIG. 9.

Alternatively, computation of the y[0] parity bit P may be carried out in the NRZ domain. Using the NRZ domain methodology, y[0] is set to 0 and the correct parity bit $z[0]=z[33] \oplus z[32] \oplus z[31] \oplus z[30] \oplus \ldots \oplus z[2] \oplus z[1]$ is inserted into the bit stream output by the precoder. Some adjustments are preferably made to the precoder in order to ensure correct operation, i.e. memory is preferably loaded with parity bit.

Although the parity bit P is described as positioned at bit 0 in the above-described examples of the 34-bit codeword, any position may be selected to contain the parity bit P.

Figure 10:
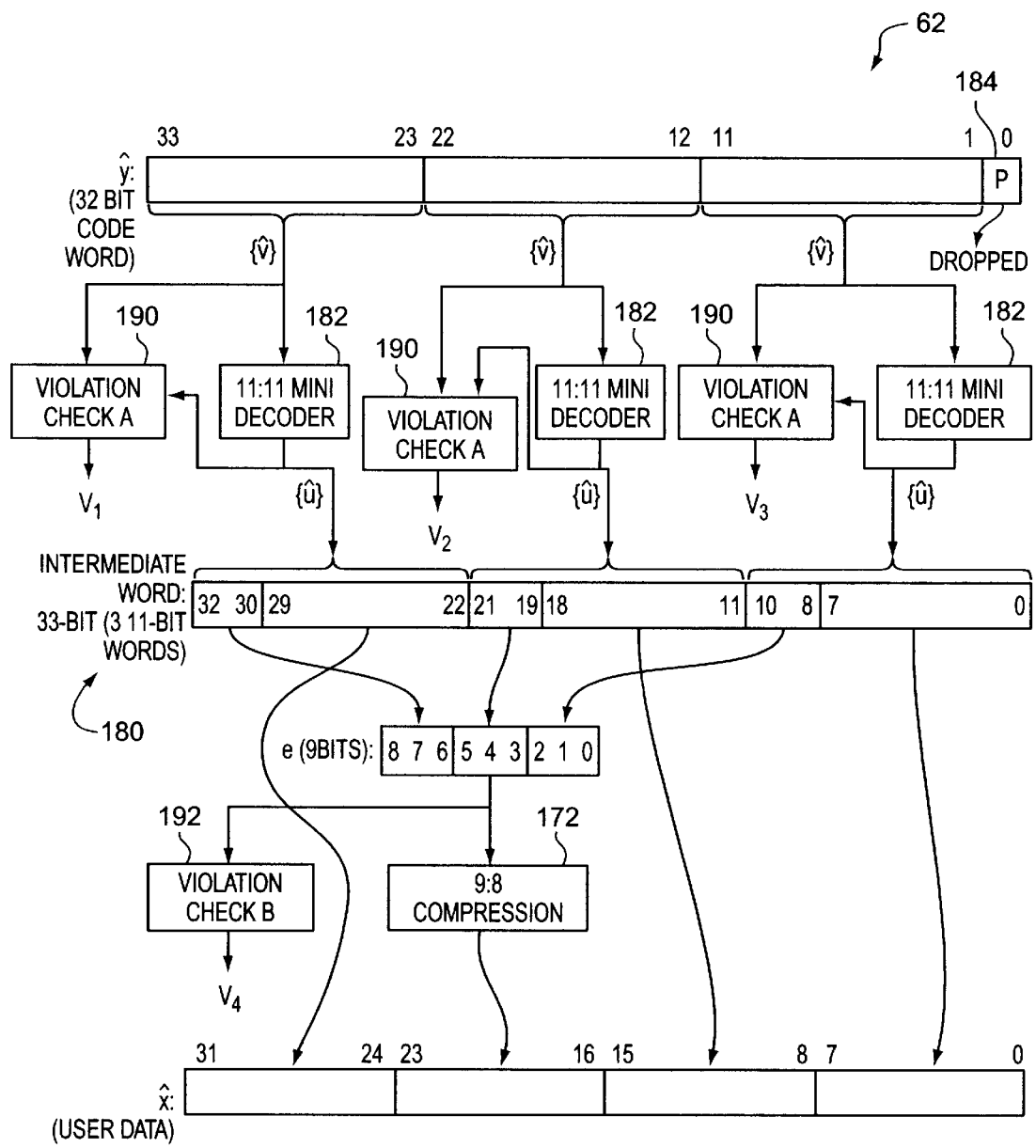
FIG. 10 shows a schematic illustrating the operations of the decoder.

FIG. 10 shows a schematic illustrating the operations of the decoder 62. The decoder 62 receives as input 34-bit codeword $\{\hat{y}_i\}$, i=0 to 33, consisting of three 11-bit blocks and a parity bit P. The decoder 62 essentially reverses the processes of the encoder as described above.

As the parity bit P 184 is not utilized by the decoder, the decoder 62 drops the parity bit P 184. Each of the three 11-bit blocks $\{\hat{v}\}$ is passed through an 11-bit mini decoder 182. The output of the 11-bit mini decoder 182 is an 11-bit decoded block $\{\hat{u}\}$. The three 11-bit blocks $\{\hat{u}\}$ form an intermediate 33-bit word 180. Each of the three 11-bit blocks $\{\hat{u}\}$ of the intermediate 33-bit word 180 is divided into a 3-bit block and a byte.

The three 3-bit blocks are grouped into a 9-bit block $\{\hat{e}\}$ 174 and input to a nine-to-eight bit compression process 172 to generate an eight bit word or a byte. Specifically, bits 8 to 10, 19 to 21, and 30 to 32 of the intermediate word 80 are utilized as bits 0 to 2, 3 to 5, and 6 to 8 of the expanded 9 bit word 74, respectively.

The compressed byte along with the three bytes of the intermediate word 180 are then grouped into a 32-bit or 4-byte user data $\{\hat{x}\}$. The specific placements of the three bytes of the intermediate word 180 and the single output byte of the compression process 172 into the 4 bytes of the user data $\{\hat{x}\}$ reverse the encoding process and thus are dependent upon the process of the encoder described above. For example, where the byte having bits 16 to 23 of the user data {x} was subjected to expansion process by the encoder, the byte resulting from the compression process 172 of the decoder would be the byte having bits 16 to 23 of the user data $\{\hat{x}\}$. The three bytes of the intermediate word 180 having bits 0 to 7, 11 to 18, and 22 to 29 are utilized as bits 0 to 7, 8 to 15, and 24 to 31, respectively, of the user data $\{\hat{x}\}$. As noted above, the byte having bits 8 to 15 may alternatively be subjected to the process by the encoder. In such a case, the byte resulting from the compression process 172 of the decoder would be the bytes having bits 8 to 15 of the user data $\{\hat{x}\}$. In addition, the three bytes of the intermediate word 180 having bits 0 to 7, 11 to 18, and 22 to 29 would be utilized as bits 0 to 7, 16 to 23, and 24 to 31, respectively, of the user data $\{\hat{x}\}$.

As shown in FIG. 10, each of the 11-bit block $\{\hat{v}\}$ and respective output $\{\hat{u}\}$ of the mini decoder 182 are passed through a violation check A 190. Specifically, each of the three violation checks 190 receives an 11-bit block of bits 23 to 33, 12 to 22, and 1 to 11 of the input 34-bit codeword $\{\hat{y}\}$ and the corresponding 11-bit output $\{\hat{u}\}$ of the mini decoder 182 and output violation flags $V_1$, $V_2$, and $V_3$, respectively. In addition, the 9-bit block $\{\hat{e}\}$ 174 is also passed through a violation check B 192 which outputs a violation flag $V_4$. Thus, all bits of the input 34-bit codeword $\{\hat{y}\}$ are passed though one of the violation checks 190, 192.

FIG. 11 is a block diagram schematically illustrating the function of the 11-bit mini decoder 182. The 11-bit mini decoder 182 receives a 11-bit input word $\{\hat{v}\}$, encodes the input word $\{\hat{v}+\}$, and outputs a 11-bit output word $\{\hat{u}\}$. The 11-bit mini decoder 182 reverses the process of the mini encoder, i.e. undoes the mapping of the mini encoder. If the input does not correspond to a valid codeword, e.g. one of the 1792 valid 11-bit codewords, then the 11-bit mini decoder 182 maps the input $\{\hat{v}\}$ to an all zero output $\{\hat{u}\}$ in order to simplify the codeword violation detector.

FIG. 12 sets forth logic equations for the 11-bit mini decoder 182 that receives the 11-bit input word $\{\hat{v}\}$ and outputs the 11-bit output word $\{\hat{u}\}$ of the 33-bit intermediate word 180. Input and output words $\{\hat{v}\}$ and $\{\hat{u}\}$ are written as $\{v\}$ and $\{u\}$, respectively, for purposes of simplicity. As shown, two internal variables $\{p\}$ and $\{q\}$ are utilized to determine the 11-bit output word $\{\hat{u}\}$. Combining a set of three 11-bit output words $\{\hat{u}\}$ generated by the 11-bit mini decoder results in a 33-bit intermediate word.

Figures 13, 14, 15, 16:
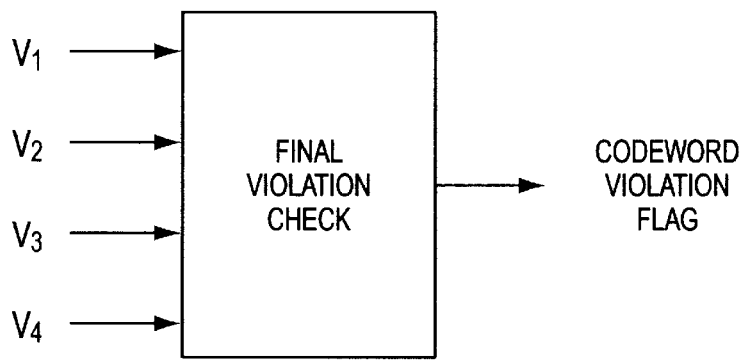
FIG. 13 sets forth logic equations for the nine-to-eight bit compression process.
FIGS. 14 and 15 set forth logic equations for the violation checks which generate the violation flags $V_{1-3}$ and $V_4$, respectively.
FIG. 16 shows a schematic of a final violation check for generating an overall codeword error violation flag.

FIG. 13 sets forth logic equations for the nine-to-eight bit compression process. The nine-to-eight bit compression process simply reverses the eight-to-nine bit expansion process of the encoder. Input and output words $\{\hat{e}\}$ and $\{\hat{x}\}$ are written as $\{e\}$ and $\{x\}$, respectively, for purposes of simplicity. As shown, internal variables $q_1, q_2, q_3$, and $q_4$ are utilized.

FIGS. 14 and 15 set forth logic equations for the violation checks 190, 192 which generate the violation flags $V_{1-3}$ and $V_4$, respectively. The codeword violation flag provides an indication that the received input codeword $\{\hat{y}\}$ does not correspond to a valid data sequence. For example, errors and/or noises may have corrupted $\{\hat{y}\}$. The overall violation condition may be determined by four violation checks, one for each of the three mini decoders and one for the nine-to-eight bit compression process.

As noted above, each of the mini decoders decode to an all zero output if the input is not valid. However, there is a single valid input that also decodes to an all zero output. Thus, the corresponding violation flag $V_{1-3}$, is set to true or 1, i.e. declare a violation, if the output is all zeros and the input does not equal that single valid input which maps to an all-zero output. The logic equations for the violation check A 190 are as shown in FIG. 14.

To determine whether there is a violation on the nine-to-eight bit compression process, the violation check B 192 determines whether the output word $\{\hat{e}\}$ of the nine-to-eight bit compression process is a valid word. If the output word $\{\hat{e}\}$ is not valid, i.e. cannot be produced by the encoder, then the value of $V_4$ is true or 1.

FIG. 16 shows a schematic of a final violation check for generating an overall codeword error violation flag. If any of the violation flags $V_{1-4}$ is set, i.e. equals to 1, then the codeword error violation flag for an overall violation detection is also set, i.e. equals to 1. The codeword error violation flag is given by the logic equation:

$$\text{Codeword Error Violation Flag} = V_1 + V_2 + V_3 + V_4$$

While the preferred embodiments of the present invention are described and illustrated herein, it will be appreciated that they are merely illustrative and that modifications can be made to these embodiments without departing from the spirit of the invention. Thus, the invention is intended to be defined only in terms of the following claims.

What is claimed is:

1. A method for encoding a sequence of 32 bit digital data words into a sequence of codewords having more than 32 bits, comprising:
   dividing each 32 bit digital data word into three 8-bit bytes and another 8-bit byte;
   expanding said another 8-bit byte into a 9-bit word;
   dividing the 9-bit word into three 3-bit subparts;
   forming three 11-bit intermediate blocks, each comprising one of the three 3-bit subparts and one of the three 8-bit bytes;
   encoding each of the three 11-bit intermediate blocks to generate three 11-bit encoded words; and
   forming each codeword from a set of the three 11-bit encoded words, wherein said set of the three 11-bit encoded words satisfies a predetermined minimum zero run length (d) constraint, a predetermined maximum zero run length (G) constraint, and a predetermined maximum interleave zero run length (I) coding constraint.

2. The method for encoding according to claim 1, further comprising decoding the sequence of codewords having more than 32 bits, said decoding comprising:
   dividing said codeword into three 11-bit words to be decoded, said 11-bit words to be decoded corresponding to said three 11-bit encoded words;
   decoding each of said 11-bit words to be decoded to generate three 11-bit decoded words; and
   dividing each of the three 11-bit decoded words into a 3-bit decoded block corresponding to said 3-bit subpart and an 8-bit decoded byte corresponding to said 8-bit bytes of said 32 bit digital data;
   forming a 9-bit decoded word from said three 3-bit decoded blocks;
   compressing said 9-bit decoded word into an 8-bit compressed byte corresponding to said another 8-bit byte of said 32 bit digital data; and
   forming a decoded codeword corresponding to said 32 bit digital data.

3. The method for encoding according to claim 2, wherein said decoding each of said 11-bit encoded words includes decoding each 11-bit word to be decoded having an invalid value to a predetermined 11-bit decoded word, said checking for violation by the violation checker includes checking for said predetermined 11-bit decoded word.

4. The method for encoding according to claim 3, wherein each bit of said predetermined 11-bit decoded word has a value of 0.

5. The method for encoding according to claim 2, wherein said decoding the sequence of codewords further comprises:
   receiving each of said three 11-bit encoded words and a corresponding one of said three 11-bit decoded words into a violation checker; and
   checking for violation by the violation checker.

6. The method for encoding according to claim 2, wherein said decoding the sequence of codewords further comprises:
   receiving said 8-bit compressed byte into a violation checker; and
   checking for violation by said violation checker in said 8-bit compressed byte.

7. The method for encoding according to claim 1, further comprising generating a parity bit, wherein the codeword is formed from the set of three 11-bit encoded words and the parity bit.

8. The method for encoding according to claim 2, further comprising precoding said codeword to generate a precoded codeword, wherein said parity bit is dependent upon value of said precoded codeword.

9. The method for encoding according to claim 1, wherein each 32 bit digital data word comprises bits 0 to 31, said another 8-bit byte is selected from the group consisting of bits 8 to 15 and bits 16 to 23.

10. The method for encoding according to claim 1, wherein said expanding generates said three 3-bit subparts such that each of said 3-bit subparts contains at least one bit having a value of zero.

11. The method for encoding according to claim 1, wherein said expanding is reversible such that said another 8-bit byte is derivable from said 9-bit word.

12. The method for encoding according to claim 1, wherein said codeword formed from the set of three 11-bit encoded words satisfies coding constraints where d is 0, G is at least 8, and I is at least 8.

13. The method for encoding according to claim 1, wherein each of said 11-bit encoded words $\{v[0], v[1], v[2], v[3], v[4], v[5], v[6], v[7], v[8], v[9], v[10]\}$ satisfy logic equations:

$v[10] \oplus v[9] \oplus v[8] \oplus v[7] \oplus v[6] = 1;$ $v[4] \oplus v[3] \oplus v[2] \oplus v[1] \oplus v[0] = 1;$ $v[10] \oplus v[8] \oplus v[6] \oplus v[4] \oplus v[2] = 1;$ $v[8] \oplus v[6] \oplus v[4] \oplus v[2] \oplus v[0] 1;$ and $v[9] \oplus v[7] \oplus v[5] \oplus v[3] \oplus v[1] = 1.$ 14. The method for encoding according to claim 1, wherein said expanding, dividing the 9-bit word, and forming said 11-bit intermediate blocks restrict each of said 11-bit intermediate blocks to one of N values, wherein N is at least 1626.

15. A system for encoding a sequence of 32 bit digital data words into a sequence of codewords having more than 32 bits for recording upon a recording medium, each of said digital data words comprising three 8-bit bytes and another 8-bit byte, said system comprising:

an eight-to-nine bit expansion block configured to receive said another 8-bit byte of the digital data, the expansion block being adapted to expand the 9-bit byte of digital data into a 9-bit expanded word comprising three 3-bit subparts; and at least one 11-bit encoder, each 11-bit encoder adapted to receive an 11-bit word, each 11-bit word formed from one of the three 8-bit bytes of the digital data and from one of said three 3-bit subparts of the nine-bit expanded word, each 11-bit encoder configured to output an 11-bit encoded word, the codeword being formed from three of said 11-bit encoded word, the codeword satisfying a predetermined minimum zero run length (d) constraint, a predetermined maximum zero run length (G) constraint, and a maximum interleave zero run length (I) coding constraint.

16. The system for encoding according to claim 15, further comprising a decoder for decoding the sequence of codewords having more than 32 bits, said decoder comprising:

at least one 11-bit mini-decoder to generate three 11-bit decoded words from the codeword, each 11-bit mini-decoder adapted to receive an 11-bit word of the codeword, each 11-bit word corresponding to one of the 11-bit encoded words;

a nine-to-eight bit compression block configured to compress a nine-bit word into an eight-bit word, said compression block adapted to receive three bits of each of three 11-bit decoded words, said three bits of each of said three 11-bit decoded words corresponding to the three 3-bit subparts of the 9-bit expanded word generated by said expansion block.

17. The system for encoding according to claim 16, wherein said 11-bit mini-decoder is configured to decode each 11-bit encoded word having an invalid value to a predetermined 11-bit decoded word and wherein said violation checker is configured to check for said predetermined 11-bit decoded word.

18. The system for encoding according to claim 17, wherein each bit of said predetermined 11-bit decoded word has a value of 0.

19. The system for encoding according to claim 16, wherein said decoder further comprises a violation checker configured to receive each of said three 11-bit word of the codeword and a corresponding one of said three 11-bit decoded words, said violation checker adapted to check for violation in each of 11-bit word of the codeword.

20. The system for encoding according to claim 16, wherein said decoder further comprises a violation checker configured to receive said 8-bit compressed byte, said violation checker adapted to check for violation in said 8-bit compressed byte.

21. The system for encoding according to claim 15, further comprising a parity bit generator, wherein said codeword is formed from said three 11-bit encoded words and the parity bit.

22. The system for encoding according to claim 21, further comprising a precoder for generating a precoded codeword, wherein said parity bit is dependent upon value of said precoded codeword.

23. The system for encoding according to claim 15, wherein each 32 bit digital data word comprises bits 0 to 31, said another 8-bit byte of the digital data is selected from the group consisting of bits 8 to 15 and bits 16 to 23.

24. The system for encoding according to claim 15, wherein said eight-to-nine expansion block is further configured to generate said three 3-bit subparts such that each of said three 3-bit subparts of the nine-bit expanded word contains at least one bit having a value of zero.

25. The system for encoding according to claim 15, wherein said one of the four bytes of the digital data to be expanded is derivable from said 9-bit expanded word.

26. The system for encoding according to claim 15, wherein said codeword formed from the set of three 11-bit encoded words satisfies (d=0, G=8/I=8) coding constraints.

27. The system for encoding according to claim 15, wherein each of said 11-bit encoded words $\{v[0], v[1], v[2], v[3], v[4], v[5], v[6], v[7], v[8], v[9], v[10]\}$ satisfy the following logic equations:

$v[10] \oplus v[9] \oplus v[8] \oplus v[7] \oplus v[6] = 1;$ $v[4] \oplus v[3] \oplus v[2] \oplus v[1] \oplus v[0] = 1;$ $v[10] \oplus v[8] \oplus v[6] \oplus v[4] \oplus v[2] = 1;$ $v[8] \oplus v[6] \oplus v[4] \oplus v[2] \oplus v[0] = 1;$ and $v[9] \oplus v[7] \oplus v[5] \oplus v[3] \oplus v[1] = 1.$ 28. The system for encoding according to claim 15, wherein said 11-bit encoded word output by said 11-bit encoder is restricted to one of N values, wherein N is at least 1626.

* * * * *